United States Patent [19]

Shimamura

[11] 4,287,029
[45] Sep. 1, 1981

[54] PLATING PROCESS
[75] Inventor: Kouichi Shimamura, Yokohama, Japan
[73] Assignee: Sonix Limited, Kanagawa, Japan
[21] Appl. No.: 133,130
[22] Filed: Mar. 24, 1980
[30] Foreign Application Priority Data
Aug. 9, 1979 [JP] Japan .............................. 54-100772
[51] Int. Cl.$^3$ .................... C25D 5/02; C25D 5/08
[52] U.S. Cl. ................................. 204/15; 204/DIG. 7
[58] Field of Search ................. 204/15, DIG. 7, 27, 204/129.6, 129.65
[56] References Cited
U.S. PATENT DOCUMENTS

| 2,958,636 | 11/1960 | Hershinger | 204/129.6 |
| 3,039,514 | 6/1962 | Swartzman | 204/129.6 |
| 3,075,902 | 1/1963 | Bradley | 204/15 |
| 4,083,755 | 4/1978 | Murata | 204/15 |
| 4,090,928 | 5/1978 | Pantiga | 204/15 |

Primary Examiner—T. M. Tufariello
Attorney, Agent, or Firm—Michael J. Striker

[57] ABSTRACT

This invention relates to a plating process and its means, wherein an accurate plating for a smaller work surface is carried out high-speedily. For this purpose, the smaller work surface is enclosed by a mask of the plating means, and a plating solution is jetted for the work surface from a nozzle disposed within a closed space of the mask inside. Further, the plating process according to this invention has a step for suctioning and discharging speedily an extra plating solution together with atmosphere within the closed space as well as outer air induced by an outer air induction means. Further, the used plating solution is again returned to a plating solution tank by a preferred recycling system. Thus, the consumption of the plating solution is saved greatly.

11 Claims, 31 Drawing Figures

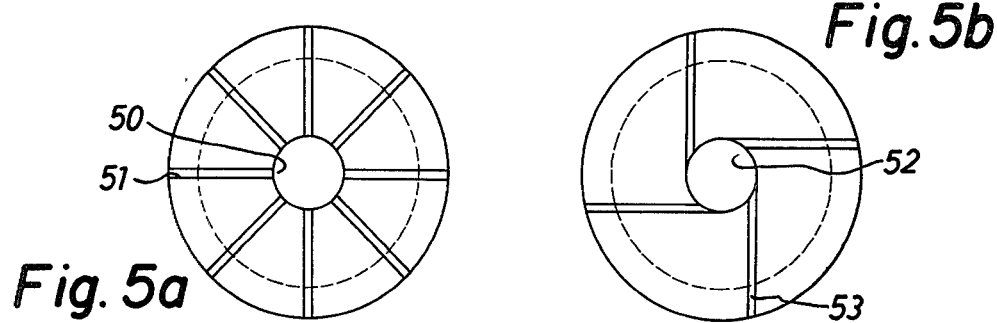
Fig. 5a  Fig. 5b
Fig. 6
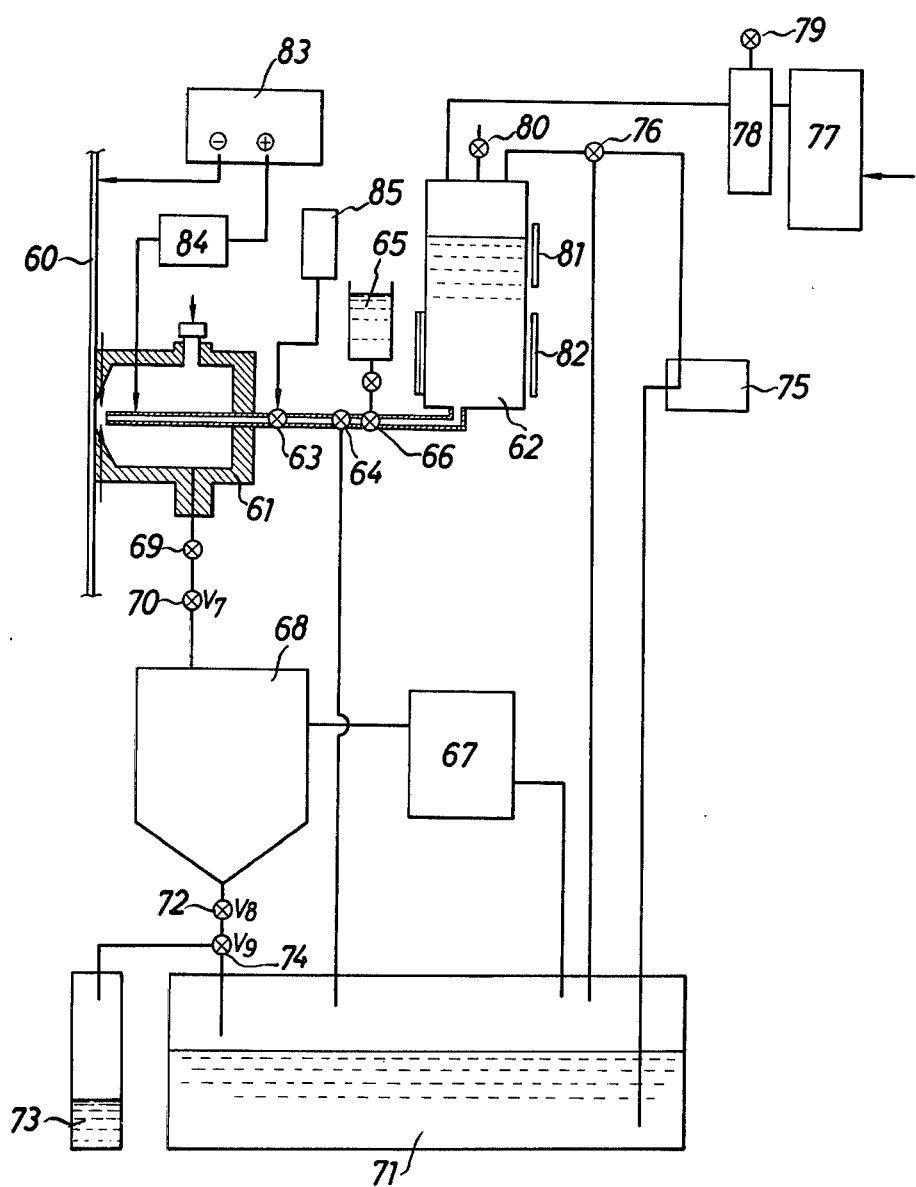

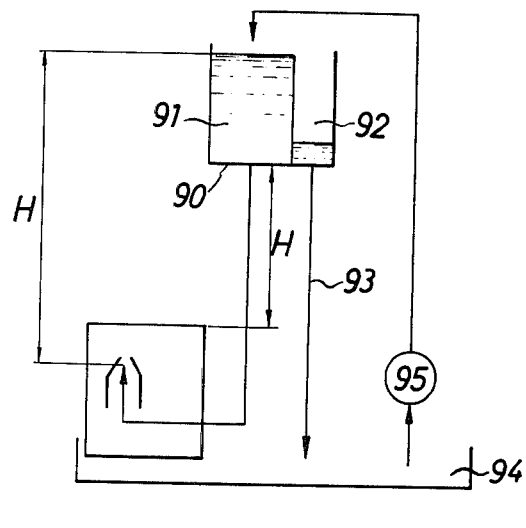
Fig.7
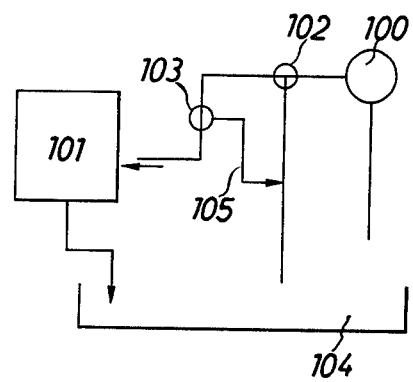
Fig.8
Fig.9a
Plating solution jetting
Current ON
→ Time: t
Fig.9b
Plating solution jetting
Current ON
→ Time: t
Fig.9c
Plating solution jetting
Current ON
→ Time: t
Fig.9d
Plating solution jetting
Current ON
→ Time: t
Fig.9e
Plating solution jetting
Current ON
→ Time: t NO.
1 Loading
2 Degreasing
3 Water washing
4 Pickling
5 Water washing
6 Water washing
7 Gold plating
8 Recycled water washing
9 Hot water washing
10 Drying by heated wind
11 Measurement (plate thickness) or spare
12 Unloading
13 Roller Fig. 17
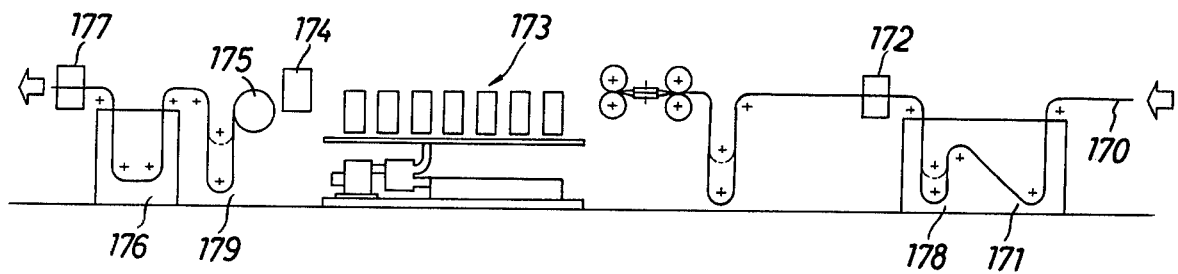
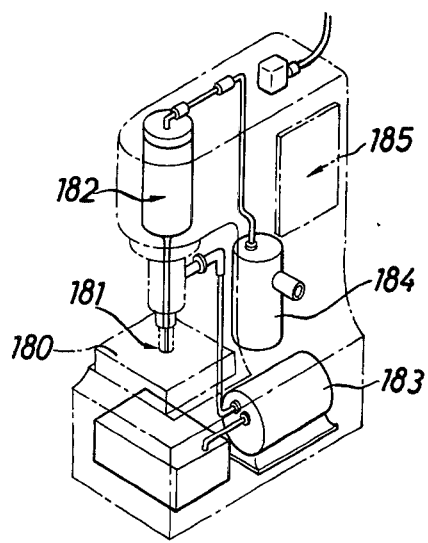
Fig. 18a
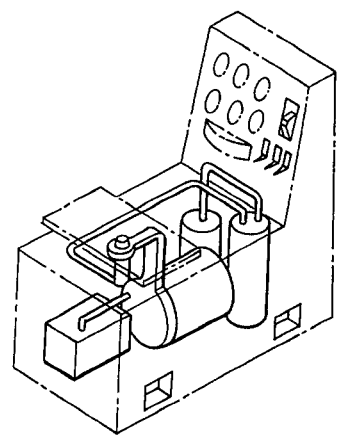
Fig. 18b

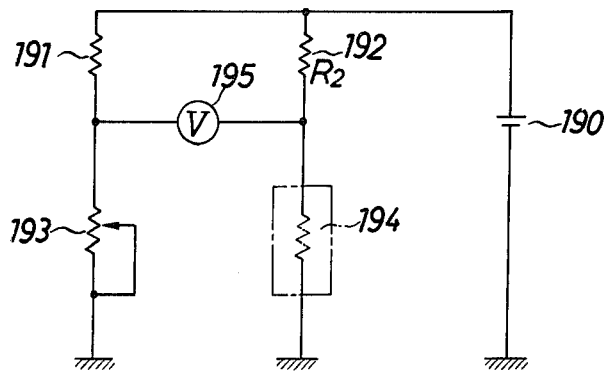
Fig.19
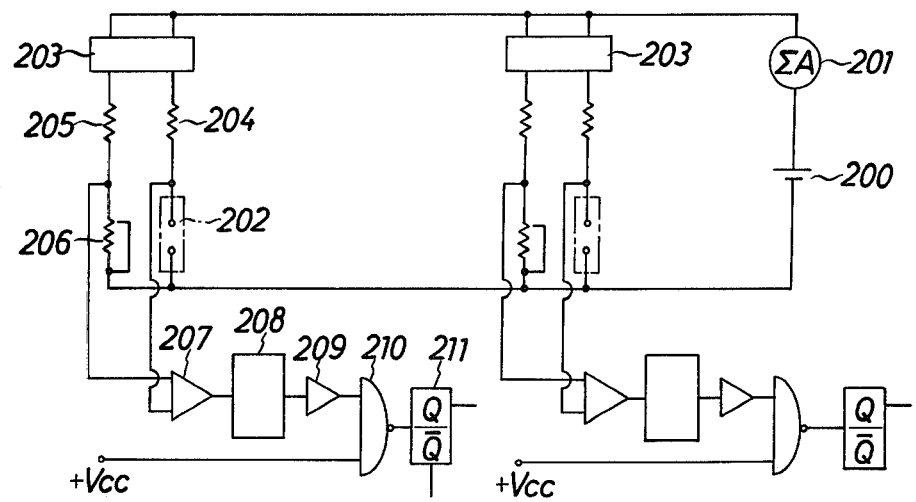
Fig.20
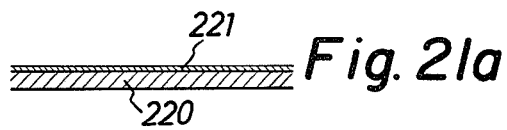
Fig. 21a
Fig. 21b
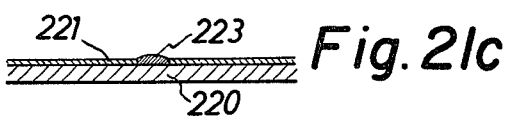
Fig. 21c
Fig. 21d

PLATING PROCESS

BACKGROUND OF THE INVENTION

This invention relates to a plating process and its means wherein an accurate plating can be carried out on a partitive work surface.

Today, there are being practiced various kinds of partitive plating processes and their means. However, these conventional techniques have the following defects and disadvantages.

(1) A sufficient supply of metal ion is impossible and an electric current density is, for example, of a low level of 20 to 30 A/dm². Accordingly, a plating process requires a longer time and its plating apparatus is large-scale.

(2) Although there is used a specific mask for covering a work surface, a circumference of a plated part is apt to become blurred. In other words, a profile of the plated part has no accurate definition. Therefore, the smaller the work surface becomes, the worse the plating finish becomes.

(3) In case the work surface is of a specifically modified shape, it takes a plenty of time to substitute a mask or the like. This is a defective bottleneck of high productivity.

The essential significance of a partitive plating is to plate exclusively a truly necessary part on the work surface. This can contribute to curtail greatly production cost of industrial products. Further, it has a very effective meaning when treating a smaller work surface with a decorative plating. For example, in case of an electric contactor, a partitive gold plating for a work surface of only less than 1 mm $\phi$ is quite sufficient. Further, when bonding a chip of a semiconductor such as IC to a terminal, a partitive gold plating for a very small work surface of less than 0.4 mm $\phi$ is quite satisfactory.

Thus, an effective plating is to treat a necessary work surface with an accurate plating.

BRIEF SUMMARY OF THE INVENTION

It is a general object of this invention to provide a plating process and its means wherein an accurate plating is carried out with high speed and high efficiency.

A principle of this invention will now be described. Generally, a flow Ni of metal ion in a plating solution i is the sum of the ion movement by electric field, diffusion due to variation of the metal ion concentration in the proximity of an electrode and the ion convection in proportion to the flow velocity of the plating solution. The variation of the metal ion concentration in the proximity of metal ion restrains a reaction speed and makes worse the current efficiency. The task of this invention is to eliminate the inconvenience of diffusion of the plating solution and to treat a smaller work surface with an immediate plating. According to a remarkable aspect of this invention, the plating solution is high-speedily with a work surface, but its flow velocity is stabilized. That is, the plating solution jetted from a nozzle is immediately discharged by utilizing a suctioned air and an accurate plating can be carried out on a smaller work surface by use of a mask having an outer air induction means. And a profile of a plated part becomes very clear. This plating process may make it possible to carry out a stripping operation due to inversion of voltage applied to an electrode.

According to one aspect of this invention, it is possible to remove nearly variation of the ion concentration in the plating solution in the proximity of negative electrode i.e. a work surface. Thus, a theoretically optimum current rate is nearly obtained which will be decided by the ion concentration, temperature, salt content, etc of the plating solution. Accoding to an experiment conducted in connection with this invention, the current density of several thousand Ampers/dm² has been obtained by using a plating solution of a few Ampers/dm² whereby a plating quality was satisfactory.

A partitive plating process compring a jetting nozzle of the plating solution and an outer tube for suctioning and discharging the plating solution is known, but it has the following defects:

(1) Soon after the plating solution is collided with a work surface, it is difficult to control its flow, whereby a wet area of the plating solution is spread up to an internal diamter of the outer tube. Accordingly, an accurate plating for a smaller work part cannot be attained.

(2) It is therefore impossible to make an uniform distribution of the current density, consequently no accurate definition of the plated part being obtained and its plating thickness becoming irregular.

(3) A distance between a jetting nozzle of the plating solution and a work surface, i.e. respective two electrodes is not considered highly. Thus, when employing a plurality of nozzles, it is particularly required to control accurately the jetting velocity of the plating solution, quantity of suctioned air and discharge of used plating solution.

The task of this invention is to remove the foregoing defects. Namely, it is to prevent an increasing consumption of the plating solution in connection with jetting high-speedily the plating solution, and to reproduce the used plating solution by a recycling system.

Other features and advantages of this invention will be apparent from the following description with reference to the accompanying drawings.

BRIEF DESCRIPTION OF THE ACCOMPANYING DRAWINGS

FIGS. 5a and 5b are respective front views of an outer air induction means mounted in the mask-nozzle means in FIG. 4.

FIG. 6 is an enlarged detail of an example of a plating means according to this invention.

FIG. 7 is a schematic view of an example of a plating means according to this invention.

FIG. 8 is a schematic view of an example of a plating means according to this invention.

FIGS. 9a, 9b, 9c, 9d and 9e are respective graphs in which a jetting timing of the plating solution is shown by a relationship between a jetting time of the plating solution and a plating current.

FIG. 17 is a schematic view of a plating process according to this invention which is carried out continuously.

FIGS. 18a and 18b are respective perspective views of different examples of a plating means according to this invention.

FIG. 19 is a view of a principle of a plating current monitoring means to be applied for a plating means according to this invention.

FIG. 20 is a circuit diagram of the monitoring means in FIG. 19.

FIGS. 21a, 21b, 21c and 21d are respective section views showing a process for double plating to be carried out in connection with this invention.

PREFERRED EXAMPLES OF THIS INVENTION

Preferred examples of this invention will now be described in connection with the accompanying drawings.

Figure 1:
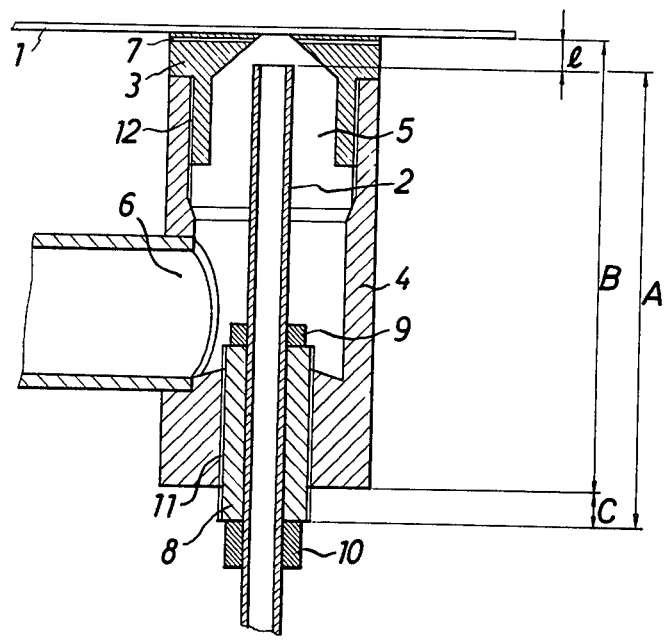
FIG. 1 is a section view of an example of a mask-nozzle means of a plating means according to this invention whereby a work surface of a smaller area can be plated.

Referring first to FIG. 1, there is shown a section view of a plating means according to this invention.

Numeral 1 is a work surface and numeral 2 is a nozzle for jetting a plating solution. A mask 3 contacts closely the work surface 1 and is positioned between the work surface 1 and the nozzle 2. Further, the mask 3 is perforated for purpose of a partitive plating. The nozzle 2 and the mask 3 are enclosed by an outer tube 4. Thus, a closed space 5 is formed between the nozzle 2, the mask 3, and the outer tube 4 and the work surface 1. The outer tube 4 is provided at one end thereof, with at least one opening 6 for discharging outer air and the plating solution. By suctioning the outer air and plating solution from the discharge opening 6, a negative pressure is formed within the closed space 5. An outer atmosphere is supplied to the closed space 5 by way of a slight gap between the work surface 1 and the mask 3, or a path 7 (outer air induction means) communicated with external atmosphere. Thus, the outer air flows toward the discharge opening 6. Owing to this air flow, a used plating liquid is speedily discharged from the discharge opening 6. In other words, this air flow prevents the plating solution flowing high-speedily from the nozzle 2 from permeating outside the mask. Thus, the plated part always forms a clear profile.

When the opening area of the nozzle 2 is defined as "D" and an opening area in the midst of the mask 3 is defined as "d", the following expression is given.

$$d/D = 0.5 - 1.5 \quad (1)$$

In general, the maximum rate of the flow velocity in the nozzle 2 is on its center axis whereas the minimum rate thereof is on a wall of the nozzle tube. Thus, the flow velocity distribution forms a parabola.

As mentioned above, the flow velocity is dependent upon the electric current density of plating. So as to satisfy the rate of d/D, it is possible to set the flow velocity distribution within a predictable given rate. That is to say, the distribution of the electric current is to be set within a given rate. The nozzle 2 may be of a positive electrode. Then, the ohm loss of the flow becomes minimum along the wall of the nozzle 2 tube, while it becomes maximum on a center axis of the nozzle 2. For this reason, the current density is distributed uniformly. Thus, the function of the mask 3 brings about a uniform plating thickness. Further, owing to the function of the outer air induction path 7 of the mask 3, the permeation of the plating solution is prevented, thereby an excellent plated surface being obtained.

Since an example of FIG. 1 is based on a jetting type plating, a diffusion layer arising between a solid phase and a liquid phase becomes extremely thin. However, as soon as the plating solution collides with the work surface 1, the used plating solution is discharged from the discharge opening 6 and it is considered that the boundary between the solid phase and the liquid phase is of a fresh liquid phase. For this reason, the diffusion layer of the plating solution is almost all suctioned and the ion density becomes uniform.

Accordingly, it may be considered that an electrolytic column is formed, so that a constant current value is obtained due to the Ohm's Law. This causes to stabilize the metal deposition rate and brings about a high-quality plating.

In a practical industrial application of this plating process, productivity of a single nozzle is rather low, so that it is much more advantageous to mount a plurality of nozzles in the plating means according to this invention. (A layout technique of a plurality of nozzles will be described in detail hereinafter.)

Now, the adjustment of a distance between two electrodes will be discussed.

Needless to say, in case there exists any flow unbalance of the plating solution, any discharge defect of the plating solution and air, or any unbalance between the two electrodes i.e. the nozzle 2 end and the work surface 1, the plating quality, plating time, current density, plate thickness, etc are seriously affected by such a phenomenon. It is necessary to to adjust a distance between the two electrodes.

In FIG. 1 the nozzle 2 is fixed with the outer tube by a screw 8 and two fixing members 9, 10. The outer tube 8 is provided with threads 11 so as to engage with the screw 8.

In FIG. 1, a distance A is from a front end of the nozzle 2 to a back end of the screw 8 and a distance B is from the work surface 1 to a back end of the outer tube 4, a distance l is between the nozzle end and the work surface 1, i.e. the two electrodes.

Thus, the following expression is obtained.

$$l + A - B = C \quad (2)$$

The distance C becomes an adjusting value by adjusting the screw 8. The value C is readable by calipers. By adjusting the screw 8 in this way, the distance l between the two electrodes is given as follows.

$$l = C + B - A \quad (3)$$

An back end of the nozzle 2 in FIG. 1 is connected with a plating solution tank (not illustrated in FIG. 1).

Further, in order that the mask 3 can be easily disengaged from the other tube 4, both the mask 3 and the outer tube 4 are treated with thread cutting. Thus, it is easy to replace the mask 3 with a new one. Therefore, a preferred mask can be selected at option, and is able to respond to various plating areas and shapes. Further, when replacing the mask 3, it may be necessary to adjust the distance 1 between the two electrodes. In this case, the adjustment of the screw 8 mounted on the nozzle 2 becomes very important.

Figure 2A:
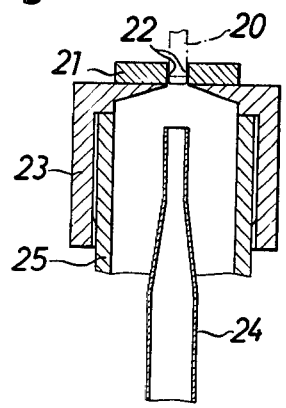
FIGS. 2a and 2b are respective section views of other examples of the mask-nozzle means in FIG. 1.
Figure 2B:
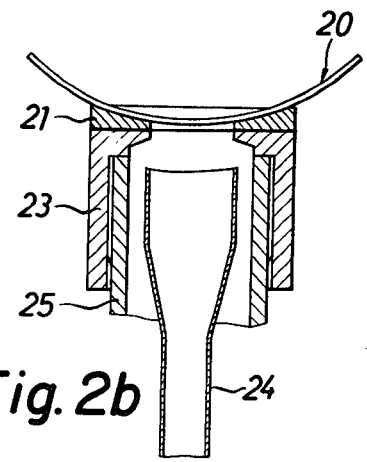

Referring to FIGS. 2a, 2b, a work surface 20 is curved. The curved work surface 20 shows for example a surface of an electric contact member. Numeral 21 is a first mask spaced with a preferred gap 22 from the curved work surface 20 and numeral 23 is a second mask of which opening area is nearly equivalent to the opening area of a nozzle 24.

A front end of the nozzle 24 has such a curved shape as to be similar to the curved work surface 20, whereby any distance between the two electrodes is to be approximately equal in any direction. The plating solution jetted from the nozzle 24 collides with the work surface 20 by way of an opening of the mask 23. After collision, the plating solution is discharged immediately from a discharge opening (not illustrated) just as shown in the example of FIG. 1. Needless to say, a certain outer air is suctioned through the gap 22 between the first mask 21 and the work surface 20. Owing to this air flow, the plating solution is prevented from permeating toward the outer air. As a result, only a desired work surface facing to the nozzle 24 can be plated. Thus, the aim of this invention is accomplished.

Figure 3:
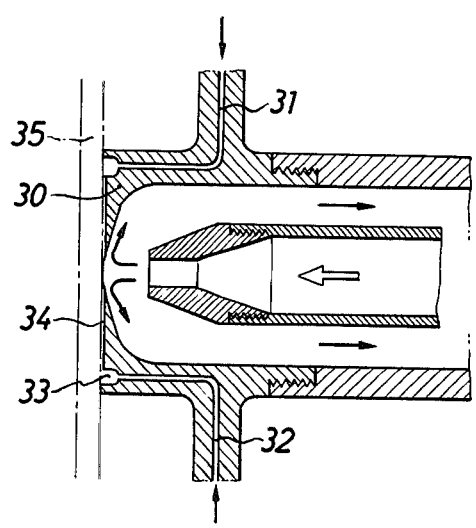
FIG. 3 is a section view of another example of the mask-nozzle means in FIG. 1.
Figure 4:
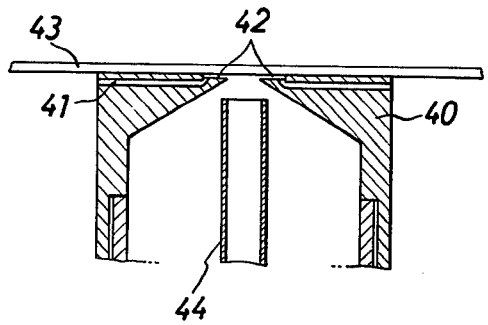
FIG. 4 is a section view of another example of the mask-nozzle means in FIG. 1.

FIGS. 3 and 4 show other examples of the mask. In FIG. 3, the mask 30 has air induction paths 31, 32 and air retaining recesses 33 whereby a highly-pressurized air is supplied from the paths 31, 32 to the air retaining recesses 33. Further, it is supplied to an opening area in the mask 30 by way of a plurality of radially formed channels 34. Under the above construction, the mask 30 may come up from the work surface 35. For this reason, the mask and the nozzle as well may move freely on the work surface 35. Therefore, for example, a continuous band-type plating (a so-called stripe plating) or a plating for describing writting letters can be achieved.

Further, the highly-pressurized air may be replaced with inert gas. The inert gas is very effective in case the plating solution acutely reacts to carbonic acid gas or oxygen contained in the air.

An example of FIG. 4 is characterized in that a mask 40 has an annular groove 42 opposing to a work surface 43. Thus, there is formed a closed space between the annular groove 42 and the work surface 43. A space inside the mask 40 is maintained with a negative pressure as shown in FIG. 1. Therefore, an outer air is supplied by way of a path 41. Unlike the example of FIG. 1, a gap between the flattened work surface 43 and the mask 40 becomes smaller. And the air volume to be supplied is determined by a diameter of the path 41 and the negative pressure. Thus, the flow velocity of the plating solution to be jetted from the nozzle 44 is stabilized more. Further, when mounting an O-ring or the like on the outer side of the annular groove 42, the contact of the groove 42 with the work surface 43 is becoming closer. The shape of the nozzle 44 is the optimum for carrying out a more accurate plating.

FIGS. 5a and 5b are plan views of the example of FIG. 4 wherein there are shown a plurality of channels for introducing the outer air. In FIG. 5a there is shown a hole 50 provided at a center of the mask 40, wherein a plurality of channels 51 are formed radially. FIG. 5b is another example, wherein a plurality of channels 53 are formed along a circumference of the hole 52. In this example, the outer air flows easily into the hole 52 along its circumference. The turbulent effect of the plating solution collided with the work surface is more effective than that in the example of FIG. 5a.

FIG. 6 shows an example of a plating means having a single system of one nozzle and one mask, although a plurality of nozzles and masks can be arranged. A mask-nozzle means 61 is linked with a plating solution tank 62. Between the mask-nozzle means 61 and the plating solution tank 62 are mounted an electromagnetic valve 63 for ON/OFF jetting of the plating solution, an adjusting vavle 64 for adjusting flow of the plating solution, a water tank 65 and a switching valve 66 to be switched to the plating solution tank 62. A suction means 67 is linked with a gas-liquid separating means 68 which is connected to the mask-nozzle means 61. Between the mask-nozzle means 61 and the gas-liquid separating means 68 are installed an adjusting valve for adjusting a negative pressure of the mask-nozzle means 61 and a release valve 70 for releasing a negative pressure of the mask-nozzle means 61. The gas-liquid separating means 68 is connected to a tank 71 for storing a plating solution. Further, between the gas-liquid separating means 68 and the plating solution tank 71 are mounted a valve 72 interlocked with the release valve 70, a waste water tank 73 and a switching valve 74 to be switched to the plating solution tank 71. The plating solution recovered by the tank 71 is returned to the upper tank 62 by actuating a feeding pump 75. Numeral 77 is an air compressor, numeral 78 a tank for reserving a highly pressurized air and numeral 79 a valve for adjusting pressure. The highly pressurized air is introduced to the plating solution tank 62. Numeral 80 is a pressure adjusting valve of the plating solution tank 62. Thus, the plating solution tank 62 is kept under a high pressure. When the plating solution is consumed, and reaches less than the level set in a leveling device 81, the switching valve 76 is released and the plating solution is supplied to the tank 62. When the valve 76 is closed, the plating solution is such that it is returned to the tank 71. Numeral 82 is a heater for keeping the plating solution under a desired temperature. Numeral 83 is a power source for plating and numeral 84 is a timer for controlling the plating time. Numeral 85 is a control section of the electromagnetic valve 63 or the like.

The operation of the plating means as shown in FIG. 6 will now be described hereinafter.

When the work surface 60 is mounted on the mask-nozzle means 61, the valves 70, 72 are closed and due to the function of the suction means 67 there arise a negative pressure within the mask-nozzle means 61. The work surface 60 is thus closely contacted with the mask-nozzle means 61.

When the valve 63 is opened, the plating solution is jetted high-speedily because the plating solution tank 62 is kept under a high pressure by means of the air compressor 77. The plating solution collided with the work surface 60 and the outer air introduced into the mask-nozzle means 61 are separated from each other by means of the gas-solution separating means 68. The plating solution remains somewhat in a form of mists in the air suctioned by the suction means 67, so that the air discharged from the suction means 67 is discharged to the plating solution tank 71, thereby the whole of the plating solution being returned thereto.

When the power source 83 is turned to "OFF" by a timer, the valve 63 is closed, subsequently the valves 70, 72 being opened and communicated to the outer air. In this case, a negative pressure within the mask-nozzle means 61 will diminish and the pressure therewithin is identical with the outer air pressure. Accordingly, a close contact of the work surface 60 with the mask-nozzle means 61 is lost whereby it becomes possible to remove easily the work surface 60 from the mask-nozzle means 61. All of the plating solution separated in the gas-liquid separating means 68 are returned to the plating solution tank 71 by way of the one-way valve 74.

In order to store a necessary quantity of highly-pressurized plating solution in the tank 62, the highly-pressurized plating solution to be fed from the feeding pump 75 is supplied to the plating solution tank 62.

In case a plurality of mask-nozzle means 61 exist, the flow velocity of each mask-nozzle means 61 is not uniform. In order to overcome this disadvantage, the jetting quantity from the nozzle is to be adjusted by adjusting the valve 64 and the flow velocity of plating solution from each nozzle is to be adjusted by adjusting a negative pressure of the mask-nozzle means by means of the valve 69.

As described above, to maintain constantly a high velocity of the plating solution, the pressure and flow control is carried out at section of the piping. Further, the flow velocity of the mask-nozzle means 61 can be controlled by a controllable baffer plate (not illustrated) which is located between the mask-nozzle means 61 and the gas-liquid separating means 68.

Any unbalanced flow velocity of the plating solution varies the current density. For example, it is advantageous to set the plating time within a certain range by adjusting the plating voltage independently.

As described above, the plating means as disclosed in the example of FIG. 6 is characterized in that the plating solution is recycled perfectly. Therefore, there exists neither outside leakage of the plating solution nor adhesion thereof to the plating means.

Since an excessive plating solution hardly adheres to the work surface, washing of the plated surface as a next process does not cause any toxicants to be brought outside. Therefore, a water treatment becomes easy and an environmental pollution is greatly removed.

FIG. 7 is an example of a plating solution tank 90 which is positioned, in view of potential energy, above a mask-nozzle means (not illustrated) in lieu of the arrangement of the plating solution tank 62, the air compressor 77 and the highly-pressurized air tank 78.

The plating solution tank 90 is divided into two tanks 91,92. Like the example of FIG. 6, the tank 91 is connected to the mask-nozzle means and the tank 92 is to store temporarily the plating solution overflowing from the tank 91. The overflowing plating solution is returned to a lower plating solution tank 94 by way of a return pipe 93 connected to the bottom of the tank 92. Numeral 95 is a pump for feeding the plating solution. The above description is different from the example of FIG. 6, and the operation of the device in FIG. 7 is the same as that in FIG. 6. The velocity of the plating solution is decided by adjusting appropriately a distance of the potential energy H.

An example of FIG. 8 has neither the tank 62 nor the tank 90. In this example, the plating solution is supplied directly to the mask-nozzle means 101 by means of the feeding pump 100. During the time when a plating treatment is being carried out, the plating solution is supplied to the mask-nozzle means 101 by way of a flow adjusting valve 103 by operating a switch valve 102. After completion of the plating treatment, the plating solution is returned to the tank 104 by switching the switch valve 102. The flow adjusting valve 103 is provided to adjust a jetting velocity from the nozzle. An excessive quantity of the plating solution is returned to the tank 104 by way of a pipe 105. The other structure is the same as that in FIG. 6.

In case the plating treatment is carried out, there is the possibility that a certain salt or the like may stick to the inside of piping because a thinner pipe in diameter is used in each example. If so, after the water content of the plating solution has been dried, the salt or the like has been crystallized and the plating solution flow will be worsened. To avoid this disadvantage, by switching the switching valve 66 and/or the switching valve 74, the mask-nozzle means 61 and/or the gas-liquid separating means 68 are washed cleanly by the water from the water tank 65. (Refer to FIG. 6.)

Now, a power source for plating will now be described. When doing a plating treatment by the mask-nozzle means in FIG. 1, a certain resistance is in series connected to the nozzle 2. And when observing the voltage decrease of both ends of the resistance with a synchroscope or the like, a certain voltage rate for time is observed. For this reason, a timing of ON-OFF switching of the power source is selected at option. FIGS. 9a, 9b, 9c and 9d show relationships of the jetting time of the plating solution with the plating electric current. Either one of the five examples disclosed in FIG. 9 can be selected, so that a design of the control circuit for the power source can be made as one desires.

Figure 10:
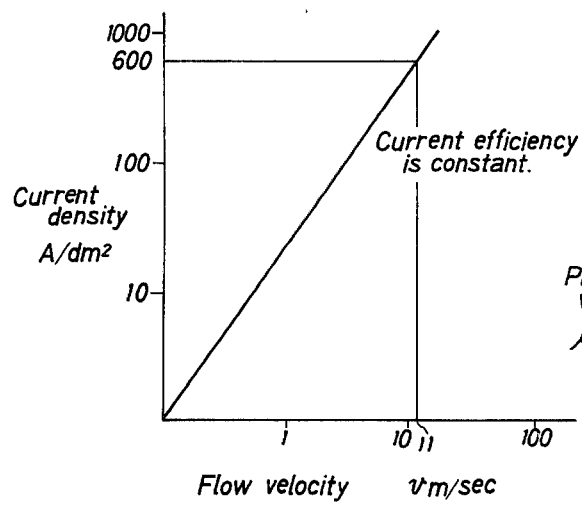
FIG. 10 is a graph showing a relationship between a jetting velocity of the plating solution and a current density.
Figure 11:
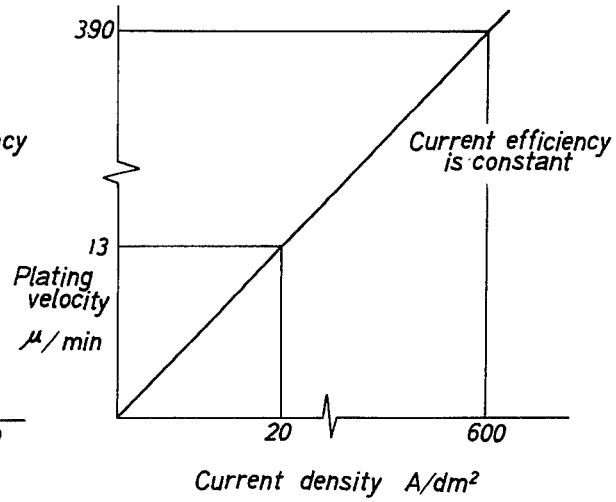
FIG. 11 is a graph showing a relationship between a plating velocity and a current density.

FIGS. 10 and 11 show respective relationship of the flow velocity of the plating solution with the electric current density wherein the plating solution is used in the example of FIG. 1. This plating solution is an ordinary acidic gold plating solution which appears on the market, and its gold density is slow, i.e. 8 g/l. As shown in FIG. 10, a relationship of the flow velocity of the plating solution with the electric current density is of a completely straight line type, but the inclination of this straight line is varied by a metal concentration and temperature of the plating solution, a voltage rate of the power source, etc. Further, the efficiency of the electric current is perfectly maintained by those values. Therefore, when the current efficiency is worsened, the straight line in FIG. 10 is lost, then a non-straight line area arises and the finished plated surface shows a phenomenon of burning.

According to the straight line as disclosed in FIG. 11, a jetted plating solution column has a perfect electric resistance. FIG. 11 shows, on the other hand, a relationship between the electric current density and the metal deposition rate. As shown in FIG. 11, it is understood that the metal deposition of the plating device in FIG. 11 is much faster than a conventional jetting plating. The testing result of the plating process according to this invention shows that it is carried out high-speedily.

Now, a plating means for a substantial industrial use for which the plating process according to this invention is applied will now be described.

As mentioned previously, an electric contractor, a semiconductor lead frame, etc. require an accurate partitive plating. Those products are being produced in a mass production system, so that productivity of the plating means according to this invention must be considered fully. When using the mask-nozzle means of FIG. 1, a metal deposition rate as shown in FIG. 11 is obtained. In this case, the plate thickness of 2μ is sufficient, so that in view of the metal deposition rate in FIG. 11 the plating time of a 0.5 secs. degree is quite sufficient. If a desirable plating solution for specified use will be selected, a preferred plate thickness can be formed in a shorter time.

Figure 12:
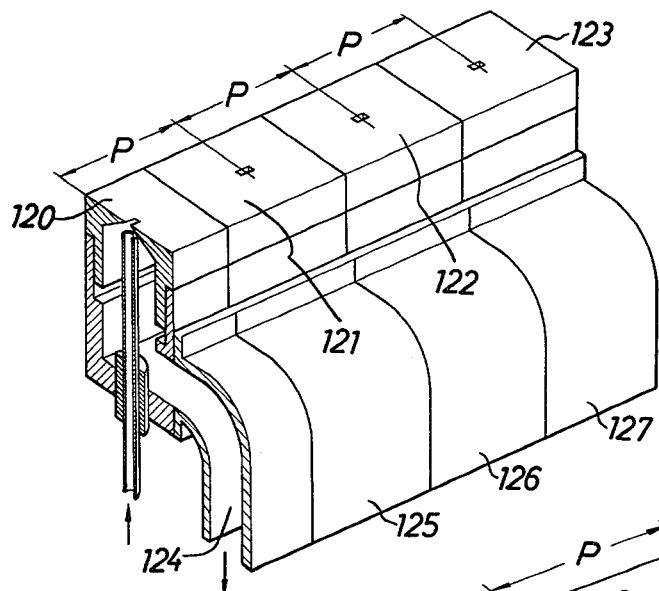
FIG. 12 is a perspective view of a plating means according to this invention in which a plurality of mask-nozzle means are formed integrally.

Generally speaking, the plating operation is applied mainly for press molding products. Accordingly, as shown in FIGS. 12 and 14, a plurality of mask-nozzle means can be mounted, thereby productivity being enhanced furthermore.

An example of FIG. 12 in which are mounted a plurality of mask-nozzle means will now be described. The plating means of FIG. 12 is suitable for a partitive plating for an electric contactor wherein a plurality of openings for respective mask-nozzle means are mounted on the same line in which a pitch between two openings may be equal to a pitch between both work surfaces.

Each of the mask-nozzle means 120, 121, 122, 123 is such that it is easily separable from an exhaust pipe. So as to cope with the requirements of various plate areas as well as various plate shapes, if a certain modulated mask-nozzle means is prepared, a plating treatment can be greatly shortened.

Figure 14:
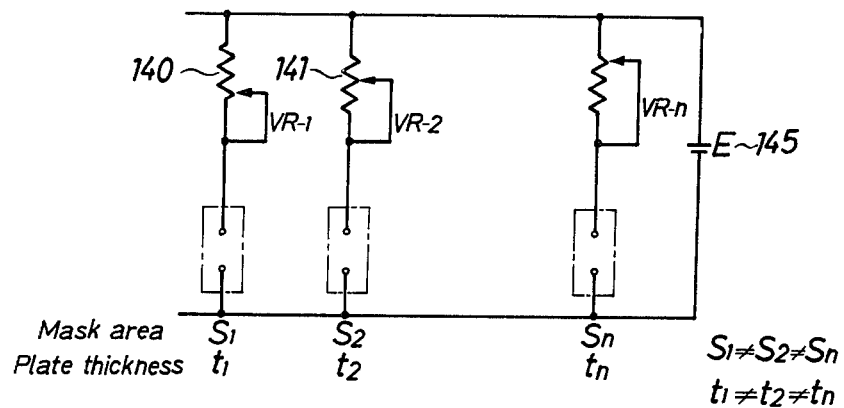
FIG. 14 is a circuit diagram for setting and controlling the plate thickness in a plurality of mask-nozzle means.

Further, there is a case in which a plate area is not uniform, e.g. spots for a partitive plating are positioned in variety (FIG. 14). In this case, even if adjusting the jetting velocity of the plating solution from the mask-nozzle means, the above requirement cannot be achieved within the same cycle time. As shown in FIG. 14, each of variable resistors 140, 141 . . . is connected in series to each electrode of the mask-nozzle means.

In FIG. 14 the mask-nozzle means requires the maximum plate area or maximum plate thickness. While maintaining the plating quality, the power source voltage E 145 is obtained so that the minimum plating time, i.e. the maximum current density of the mask-nozzle means may be obtained. After that, in order that a necessary current density of other mask-nozzle means may be obtained, each variable resistor 140, 141 . . . is adjusted. By doing so, a different plate area, shape or thickness can be formed within the same cycle by using such mask-nozzle means.

Further, each mask-nozzle means may be provided with its own power source.

Further, respective mask-nozzle means can be mounted in view of its plating purpose, for example, alloy gold plating solution, pure plating solution, etc. can be supplied to respective mask-nozzle means, whereby various plating treatments can be carried out at the same cycle time.

Figure 13:
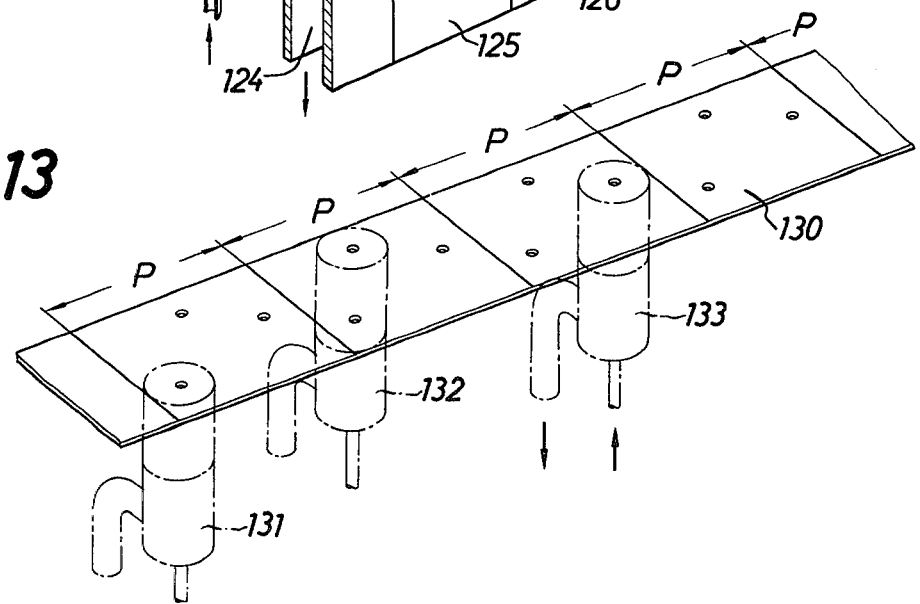
FIG. 13 is a perspective view of a work surface for which a plurality of nozzle-mask means are applied.

Referring to an example of FIG. 13, there is shown a semiconductor wire board. In this example, a plurality of partitive spots are scattered.

Three mask-nozzle means 131, 132 and 133 are arranged in order to plate respective spots which are located upwardly, intermediately and downwardly of the semiconductor wire board. Likewise, it is available to furnish each mask-nozzle means a desired plating solution.

Figure 15:
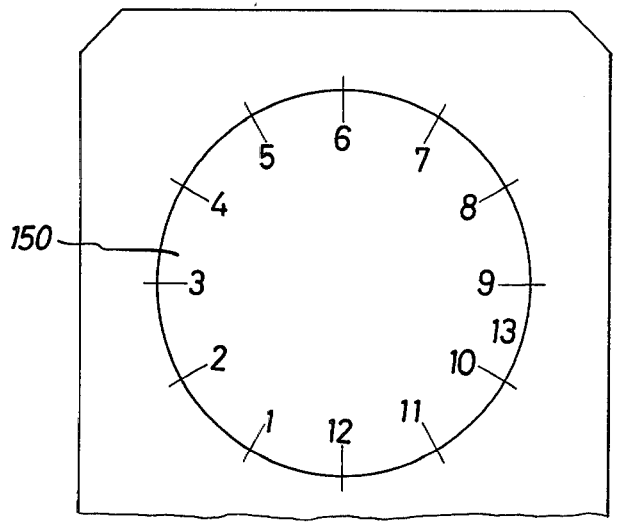
FIG. 15 is a view of a plating means according to this invention in which a rotary index table is used.
Figure 15:
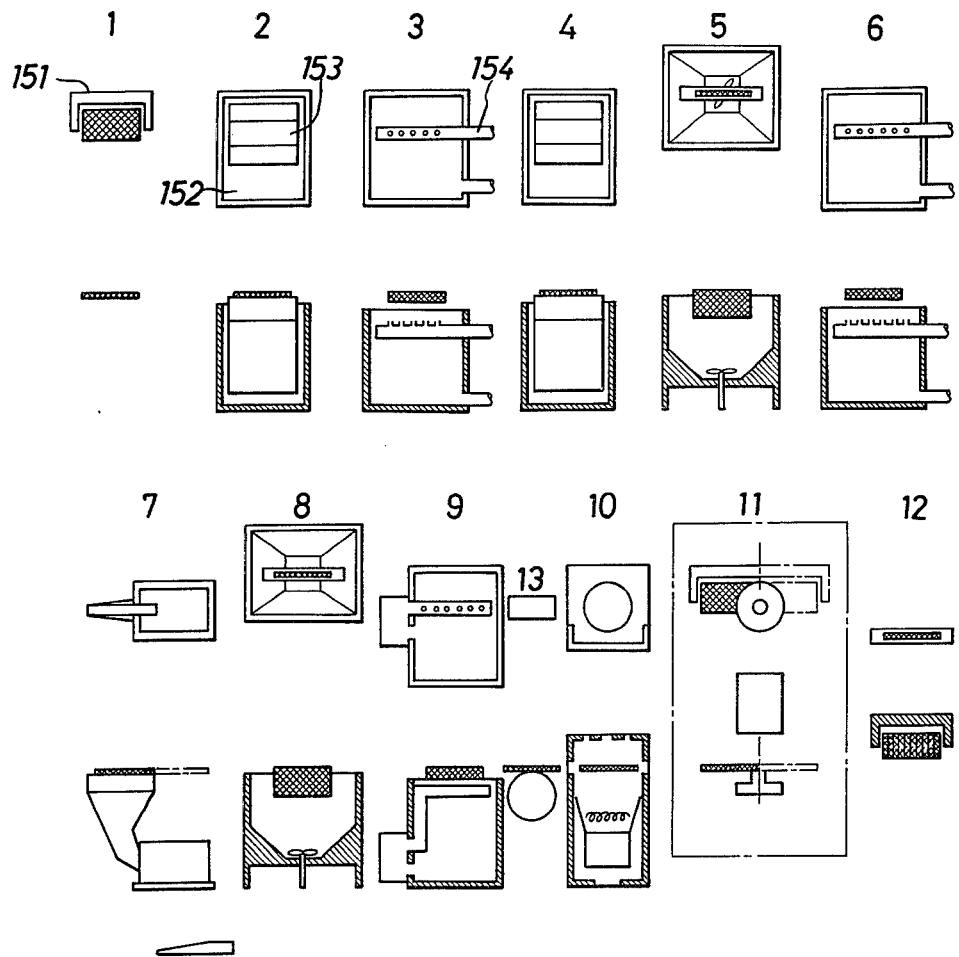

FIG. 15 shows an example of a plating means according to this invention in which is mounted a rotary index table.

In this example there are positioned 56 electric contractors on a work surface wherein the partitive plating is carried out seven times by employing eight units of the mask-nozzle means. Numeral 150 is a rotary index table in which twelve processes are indicated. In the first process an object for plating is mounted on a jig 151. As the second process a degreasing treatment is carried out. A degreasing agent is absorbed to a rotary made of felt or the like which is installed in a tank 52. The work surface is passed on the rotary 153 wherein only a necessary area is degreased. The third process is water washing in which the water is jetted. Numeral 154 is a water jetting nozzle. The fourth process is pickling. The fifth process is water washing by which any toxicants stuck to the work surface are removed. In view of the control of environmental pollution no particular means for discharging used washing water is mounted in this example. A partitive plating is carried out for 5 mm$^2$ area, so that about 1 l pickling agent is required for plating about 2,400,000 units of the electric contractors. The six process is rewashing due to jetting flow. The seventh process is a gold plating for a smaller area wherein eight units of the mask-nozzle means are used. The eighth process is again the water washing wherein a slight amount of the plating solution adhered to the plated surface (7th process) is removed and a precious metal is withdrawn. The ninth process is hot water washing, the tenth process: drying and the eleventh process: a plate thickness measuring process or a spare one. The twelveth process is a process for removing the work surface from the jig 151.

If no toxicant solution is used in the pickling process (4th process), the water washing in the 5th process becomes unnecessary. Accordingly, it may be possible to divide the gold plating (7th process) into two processes. Further, it is quite acceptable to mount a Ni plating device to the plating means of FIG. 15 prior to the aforementioned processes.

Since the plating means in FIG. 15 employs a rotary index table, the operation efficiency is very advantageous. Further, because of a partitive plating the use of toxicants is little and the cost for exhausting the waste water is small. Accordingly, the production cost is reduced greatly.

Figure 16:
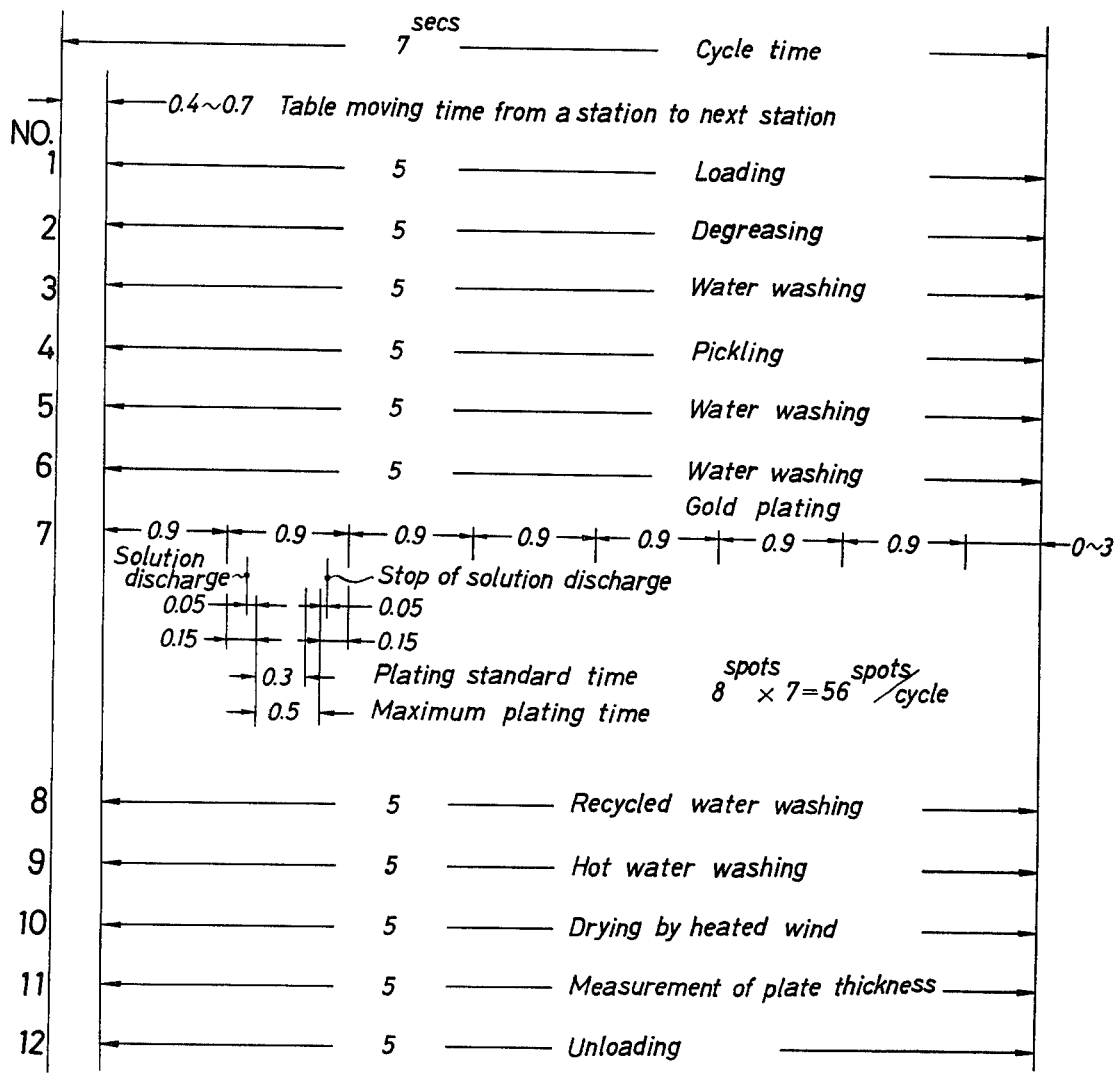
FIG. 16 is a time chart of a plating process in connection with the plating means in FIG. 15.

FIG. 16 is a time chart in which is shown a necessary time for each process in connection with the plating means in FIG. 15. The partitive gold plating in the 7th process is only 0.15 sec. by contacting the mask-nozzle means closely to a partitive work spot. However, this system has an allowance of 0.5 sec. for the plating time. Further, as for the jetting time of the plating solution, an additional jetting is carried out for 0.05 sec. before and after the plating time. Subsequently, it takes 0.15 sec. to separate the plated article from the mask-nozzle means. Accordingly, the total time of one plating cycle becomes 0.9 sec.

FIG. 17 is another example of the plating means in which a partitive plating for plating a hoop-type product is carried out continuously. In this example the hoop-type product 170 is supplied from a right-hand side, and next to this the pretreatments such as degreasing, pickling, etc. are carried out continuously in the pretreating process 17. After the hoop-type product 170 has been dried by a dryer 172, the partitive plating is carried out at a position 173. In this example, seven units of mask-nozzle means are shown. Numeral 174 is a dryer, numeral 175 an indexing means for feeding intermittently a plated product, numeral 176 a post-washing treating device and numeral 177 a dryer. Further, numerals 178 and 179 are buffers for absorbing a process gap between a continuous feeding and an intermittent feeding.

By making use of the plating means of FIG. 17, it becomes possible to plate continuously a longer product in diameter.

FIGS. 18a and 18b are respective plating means each of which has a single mask-nozzle means. This plating means is for example applicable for a gold plating bump for bonding a LSI chip on a ceramic base plate of a hybrid LSI. This device makes use of a X-Y table. Numeral 180 is a X-Y table, numeral 181 a mask-nozzle means, numeral 182 a cartridge-type plating solution tank, numeral 183 a suction pump, numeral 184 a compressor for feeding a plating solution under an application of pressure and numeral 185 a control device. The basic operation of this plating means is the same as the operation of the plating means in FIG. 1. The X-Y table 180 is controlled by a numerically-controlled device (not illustrated). Two or more X-Y tables are also mountable if necessary, thus productivity being improved furthermore. Since the plating solution tank is of a cartridge type, it is very easy to replace with a new cartridge. As mentioned previously, the circulation of the plating solution is recycled perfectly.

In practical use of the plating process according to this invention, two or more mask-nozzle means are mounted simultaneously in the plating means. Unless the mask-nozzle means gains a fixed negative electrode current stably during the plating operation, the plate thickness becomes unbalanced. The unbalance of the plating current is caused by variations of the resistance rate of the plating solution column. Mainly, the flow velocity and its sectional area are varied. The variations are derived of a close contact of the work surface with the mask. The probability is that such a phenomenon arises. It is advantageous to monitor such phoenmenon by a certain means during the time when the plating means is being driven automatically, or to stop the operation or to give an alarm in case it will arise.

Now, the principle of a monitoring method of the plating means according to this invention will be described in connection with FIG. 19.

In FIG. 19, numeral 190 is a power source for plating, numeral 191, 192 low resistances $R_1$, $R_2$ respectively, numeral 193 a potentiometer VR, numeral 194 an electric resistance r having a jetting plate solution column and numeral 195 a voltmeter.

In FIG. 19, $R_1$, $R_2$, VR and r respectively form a resistance bridge. And there is given the resistance r indicating a plating solution column jetted from the mask-nozzle means for obtaining a given plate thickness. When having set vibration of the voltmeter 195 to zero by adjusting the potentiometer 193, the standard resistance rate of the plate solution column is memorized by the potentiometer 193. Thus, it is easy to monitor variations of the plate current of the mask-nozzle means. Further, since the decline of the ion concentration due to fatigue of the plating solution causes deformation of a bridge balance, it can be monitored as mentioned above. Still further, such arrangement is very inexpensive. The example of FIG. 19 is also applicable for the testing device of the plating solution.

FIG. 20 is a circuit diagram of an example of a plating current monitoring device in the plating means according to this invention in which a plurality of mask-nozzle means are mounted.

In FIG. 20, numeral 200 is a power source for plating, numeral 201 an ampere-hour meter, numeral 202 a mask-nozzle means, numeral 203 a timer for adjusting the plating hour, numerals 204, 205 respectively a low resistance, numeral 206 a potentiometer, numeral 207 a differential amplifier, numeral 208 a threshold rate detector which is a circuit such as a Schmidt trigger circuit, numeral 209 an amplifier, numeral 210 a NAND circuit and numeral 211 a flip-flop circuit. As mentioned above, in case a certain error of the plating current arises in the mask-nozzle means 202, the output rate of the differential amplifier 207 triggers the threshold rate detector 208, is amplified by the amplifier 209 and then input to the NAND circuit or a gate circuit 20. If a voltage of +Vcc is input during the plating time into the gate circuit 210, in case there arises a certain error of the plating current due to inversion of the flip-flop circuit 211 any abnormal conditions of the plating operation are alarmed or the operation of the plating means is stopped by an output of the flip-flop circuit 211. This monitoring device enables to operate the plating means automatically.

Referring to FIG. 21a, an insulating coating material of anti-plating-solution properties such as lacquer is coated on a work surface 220 and formed as a coated layer 211. By utilizing the mask-nozzle means of FIG. 1, an organic solvent such as a thinner in lieu of the plating solution is jetted. Then, a part of the coated layer 211 is removed as shown in FIG. 21b. The mask-nozzle means has been used as means for removing a coated layer. FIG. 21c shows a Ni plating treatment 223 which is carried out by a normal operation of the mask-nozzle means. Likewise, an Au plating treatment 224 is added to the Ni plating treatment 223 as shown in FIG. 21d. Again, it will be possible to remove part of the plated layer as necessary.

As will be understood above, the plating process of this invention can be carried out partitively on various types of work surfaces.

What is claimed is:

1. A process of continuously electroplating of an elongated electroconductive sheet, comprising the steps of enclosing a smaller work surface of the sheet with a mask thereby defining a closed space within said mask and to determine a plating shape and pattern to be produced; introducing an outer air by air induction means having no influence upon the surface of the sheet to be treated to obtain an air curtain within said mask; disposing a nozzle within said closed space; jetting a plating solution through said nozzle to said work surface while supplying electric power to different polarity to said nozzle and said work surface and simultaneously suctioning to and discharging fluid from said closed space; plating the jetted plating solution on said work surface; and discharging said plating solution together with atmosphere from in said closed space by suctioning said solution from said mask, whereby said air-introducing step speeds up said discharging step and prevents said plating solution from permeating outside said mask.

2. The process of claim 1, wherein said closing step is carried out by closing means between said mask and said smaller work surface.

3. The process of claim 2, in which said work surface is a negative electrode and a portion of or the whole of said nozzle for jetting said plating solution is a positive electrode in said electric power supplying step.

4. The process of claim 1, wherein a pretreatment solution for purpose of cleaning is jetted on said work surface in lieu of said plating solution, and a precious metal portion or a base metal portion or a resisting layer of said plating solution is removed from said work surface, and wherein further degreasing and washing treatment being able to be carried out.

5. The process of claim 1, wherein during said plating step a highly pressurized air on an inert gas is introduced into said mask by way of the outer air induction means.

6. The process of claim 3, wherein a distance between said smaller work surface and the front end of said nozzle is the one between two electrodes, said distance being controllable by preferred means.

7. The process of claim 6, wherein after the completion of the plating process said plating solution is separated from the suctioned and discharged fluid and recycled and reproduced to be further used for the plating process.

8. The process of claim 1, wherein said plating solution is jetted from said nozzle under a pressure application.

9. The process of claim 8, wherein said pressure application to the plating solution is obtained by a pump.

10. The process of claim 8, wherein said pressure application to the plating solution is obtained by pressurizing an internal pressure of the solution contained in a plating solution tank.

11. The process of claim 8, wherein said pressure application to the plating solution is obtained by making use of a potential energy of the plating solution tank.

* * * * *